(12) United States Patent
Min et al.

(10) Patent No.: US 10,825,777 B2
(45) Date of Patent: Nov. 3, 2020

(54) METHOD OF FABRICATING A SEMICONDUCTOR DEVICE WITH AN OVERLAY KEY PATTERN

(71) Applicant: SAMSUNG ELECTRONICS CO., LTD., Suwon-si, Gyeonggi-do (KR)

(72) Inventors: Taehong Min, Hwaseong-si (KR); Chan Hwang, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 20 days.

(21) Appl. No.: 16/361,546

(22) Filed: Mar. 22, 2019

(65) Prior Publication Data
US 2019/0363054 A1    Nov. 28, 2019

(30) Foreign Application Priority Data

May 28, 2018    (KR) .......................... 10-2018-0060623

(51) Int. Cl.
*H01L 23/544* (2006.01)
*H01L 45/00* (2006.01)

(52) U.S. Cl.
CPC ............ *H01L 23/544* (2013.01); *H01L 45/06* (2013.01); *H01L 45/1233* (2013.01); *H01L 45/1253* (2013.01); *H01L 45/143* (2013.01); *H01L 45/144* (2013.01); *H01L 45/146* (2013.01); *H01L 45/147* (2013.01); *H01L 45/1683* (2013.01); *H01L 45/1691* (2013.01); *H01L 2223/5446* (2013.01); *H01L 2223/54426* (2013.01)

(58) Field of Classification Search
None
See application file for complete search history.

(56) References Cited

U.S. PATENT DOCUMENTS

| 6,801,313 | B1* | 10/2004 | Yokota | G03F 7/70633 |
| | | | | 257/E23.179 |
| 7,029,591 | B2 | 4/2006 | Catabay et al. | |
| 7,485,543 | B2 | 2/2009 | Han et al. | |
| 7,589,022 | B2 | 9/2009 | Kim et al. | |
| 2001/0019880 | A1* | 9/2001 | Ebertseder | H01L 23/544 |
| | | | | 438/584 |

(Continued)

FOREIGN PATENT DOCUMENTS

| JP | H09-107028 | 4/1997 |
| KR | 10-2005-0005961 | 1/2005 |

(Continued)

*Primary Examiner* — Nilufa Rahim
(74) *Attorney, Agent, or Firm* — F. Chau & Associates, LLC

(57) ABSTRACT

A method of fabricating a semiconductor device includes providing a substrate including a first region and a second region. The method includes forming a first layer on the substrate. The first layer has a first hole on the first region and a second hole on the second region. The method includes forming a second layer in the first hole and the second hole. The method includes forming a mask pattern on the second region of the substrate. The method includes polishing the second layer to form a pattern in the first hole and an overlay key pattern in the second hole. A top surface of the overlay key pattern is further from the substrate than a top surface of the pattern in the first hole.

19 Claims, 11 Drawing Sheets

(56) References Cited

U.S. PATENT DOCUMENTS

| | | | | |
|---|---|---|---|---|
| 2002/0187613 A1* | 12/2002 | Han | ............... | H01L 27/11507 438/395 |
| 2005/0032363 A1* | 2/2005 | Ajiki | ............... | H01L 21/28518 438/664 |
| 2005/0118785 A1* | 6/2005 | Kwon | ............... | G03F 9/7076 438/427 |
| 2005/0127347 A1* | 6/2005 | Choi | ............... | H01L 21/7684 257/2 |
| 2006/0160325 A1 | 7/2006 | Choi | | |

FOREIGN PATENT DOCUMENTS

| | | |
|---|---|---|
| KR | 10-0802221 | 2/2008 |
| KR | 10-2010-0079145 | 7/2010 |

* cited by examiner

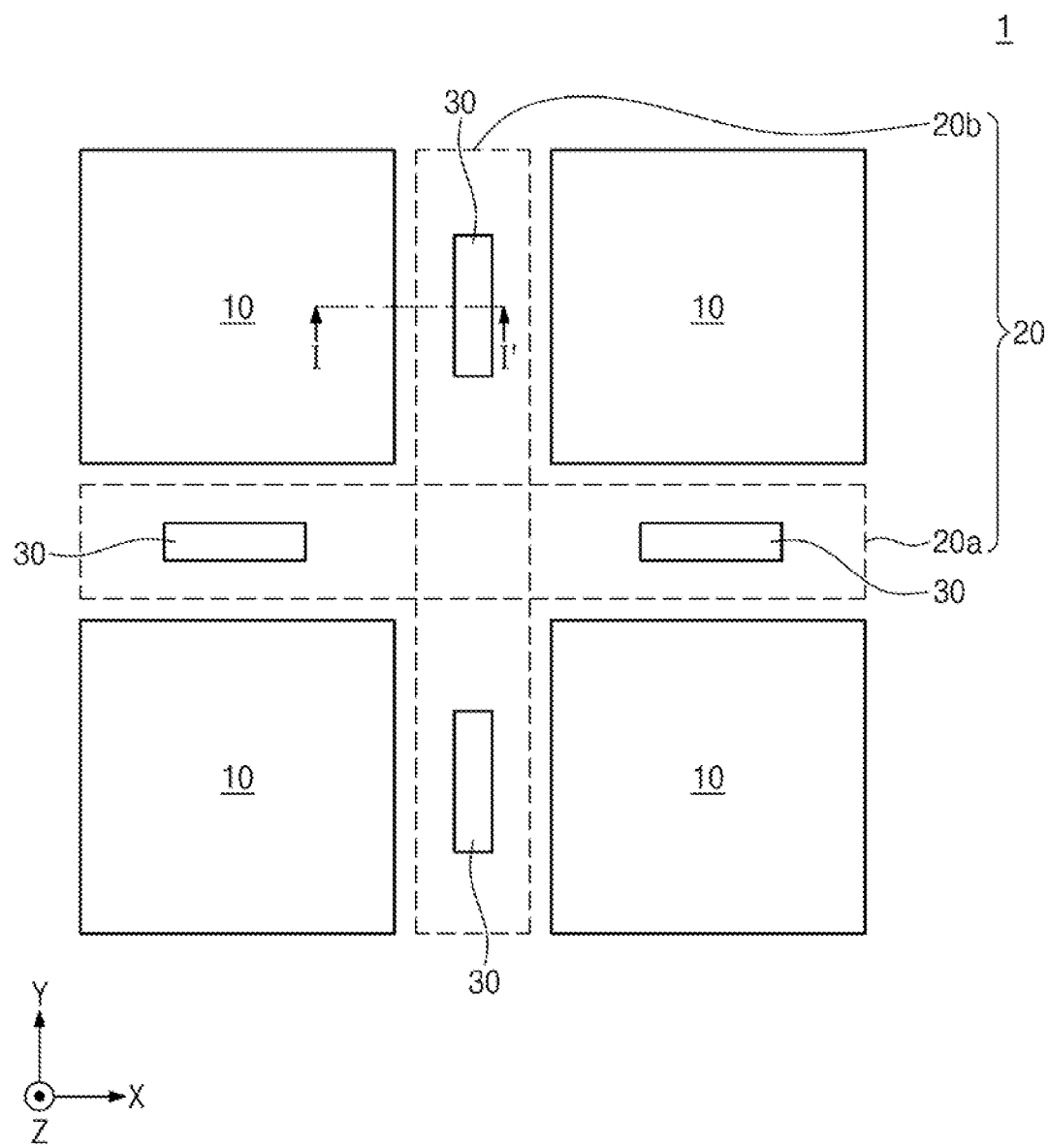

US 10,825,777 B2

METHOD OF FABRICATING A SEMICONDUCTOR DEVICE WITH AN OVERLAY KEY PATTERN

CROSS-REFERENCE TO RELATED APPLICATION

This U.S. nonprovisional application claims priority under 35 U.S.C § 119 to Korean Patent Application No. 10-2018-0060623 filed on May 28, 2018 in the Korean Intellectual Property Office, the disclosure of which is incorporated by reference herein in its entirety.

TECHNICAL FIELD

Exemplary embodiments of the present inventive concept relate to a semiconductor device, and more particularly, to a method of fabricating a semiconductor device.

DISCUSSION OF ART

In general, in order to fabricate a semiconductor device, a certain material layer is formed on a semiconductor substrate, for example, a semiconductor wafer, and then a photolithography process is performed to form desired patterns. The photolithography process may be carried out such that a photoresist layer is formed on the semiconductor substrate on a predetermined layer. A mask may be used to expose and develop the photoresist layer to form a photoresist pattern, and then the photoresist pattern may be utilized to etch the predetermined layer to form a pattern. An exposure process may be a factor in determining accuracy of a fabrication process for the semiconductor device.

In the fabrication process for the semiconductor device, the photolithography process may be repeatedly performed using an overlay key pattern to align a new pattern which will be formed in a current process with an old pattern which is already formed in a previous process. However, as the fabrication process continues to fabricate the semiconductor device, the overlay key pattern may become reduced in height such that an exposure apparatus cannot read or detect optical signals from the overlay key pattern, which may result in a reduction in reliability of the exposure process.

SUMMARY

An exemplary embodiment of the present inventive concept provides a method of fabricating a semiconductor device with increased reliability.

According to an exemplary embodiment of the present inventive concept, a method of fabricating a semiconductor device includes providing a substrate including a first region and a second region. The method includes forming a first layer on the substrate. The first layer has a first hole on the first region and a second hole on the second region. The method includes forming a second layer in the first hole and the second hole. The method includes forming a mask pattern on the second region of the substrate. The method includes polishing the second layer to form a pattern in the first hole and an overlay key pattern in the second hole. A top surface of the overlay key pattern is further from the substrate than a top surface of the pattern in the first hole.

According to an exemplary embodiment of the present inventive concept, a method of fabricating a semiconductor device includes providing a substrate including a first region and a second region. The method includes forming a first dielectric layer on the substrate. The first dielectric layer has a first trench on the first region and a hole on the second region. The method includes sequentially forming an electrode layer, a spacer layer, and a second dielectric layer on each of a top surface of the first dielectric layer, an inner surface of the first trench, and an inner surface of the hole. The method includes forming a first mask pattern on the second region of the substrate. The method includes polishing the second dielectric layer, the spacer layer, and the electrode layer to form an electrode structure and a first dielectric pattern on the electrode structure in the first trench and to form a dummy electrode structure and a second dielectric pattern on the dummy electrode structure in the hole. A top surface of the second dielectric pattern is further from the substrate than a top surface of the first dielectric pattern.

According to an exemplary embodiment of the present inventive concept, a method of forming an overlay key pattern includes providing a substrate and forming a first layer on the substrate. The method includes forming a first hole and a second hole spaced apart from the first hole in the first layer. The method includes forming a second layer on the substrate in the first hole and the second hole. The second layer is formed to extend above an upper end of the second hole opposite the substrate. The method includes polishing the second layer to form an overlay key pattern above the upper end of the second hole. The method includes forming a mask pattern on the overlay key pattern.

BRIEF DESCRIPTION OF THE DRAWINGS

The above and other features of the inventive concept will become more apparent by describing in detail exemplary embodiments thereof, with reference to the accompanying drawings, in which:

FIG. 1 is a plan view of a semiconductor wafer according to an exemplary embodiment of the present inventive concept.

DETAILED DESCRIPTION OF EMBODIMENTS

Figure 2A:
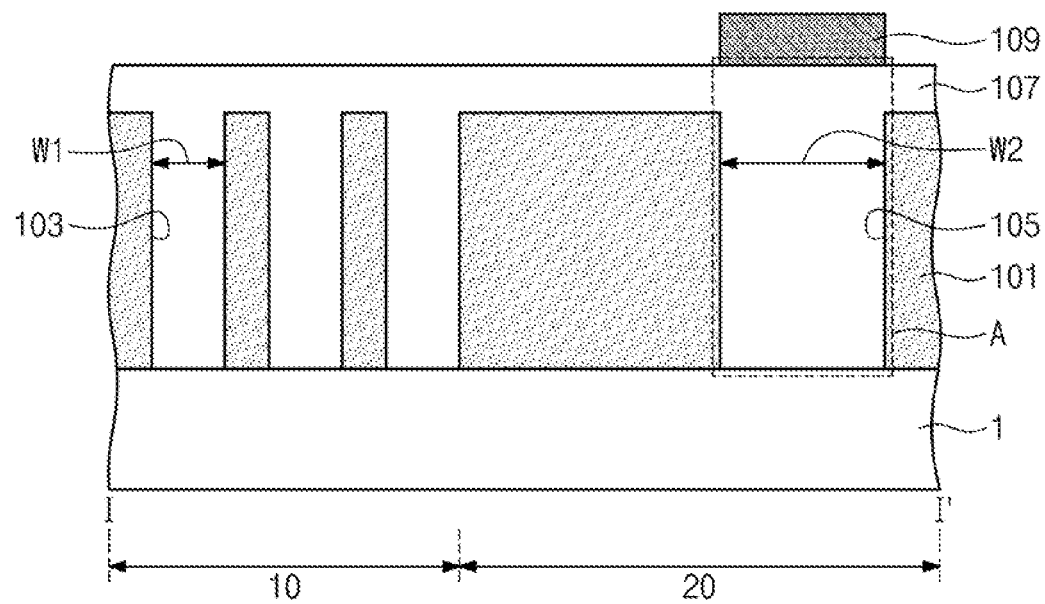
FIGS. 2A, 2B and 2C are cross-sectional views taken along line I-I' of FIG. 1, of a method of fabricating a semiconductor device according to an exemplary embodiment of the present inventive concept.

FIG. 1 is a plan view of a semiconductor wafer according to an exemplary embodiment of the present inventive concept.

Referring to FIG. 1, a semiconductor wafer 1 may include first regions 10 and a second region 20. The first regions 10 may be spaced apart from each other in first and second directions X and Y intersecting each other. The second region 20 may define the first regions 10. The second region 20 may include a first part 20a extending in the first direction X and a second part 20b extending in the second direction Y. The semiconductor wafer 1 may be interchangeably referred to as a "substrate" or a "semiconductor substrate" herein. As an example, the first direction X may be perpendicular to the second direction Y. The first direction X and the second direction Y may define a plane along which the semiconductor wafer 1 extends. A third direction Z may be perpendicular to the first and second directions X and Y. Thus, the third direction Z may be orthogonal to a plane extending in the first and second directions X and Y.

In an exemplary embodiment of the present inventive concept, the first regions 10 may be device areas. Transistors and/or semiconductor memory devices may be provided on the first regions 10 of the semiconductor wafer 1. In an exemplary embodiment of the present inventive concept, the second region 20 may be a scribe lane area. An overlay key pattern 30 may be provided on the second region 20 of the semiconductor wafer 1. The overlay key pattern 30 may be provided in plural. The plurality of overlay key patterns 30 may be disposed on the first and second parts 20a and 20b of the semiconductor wafer 1.

Figure 2B:
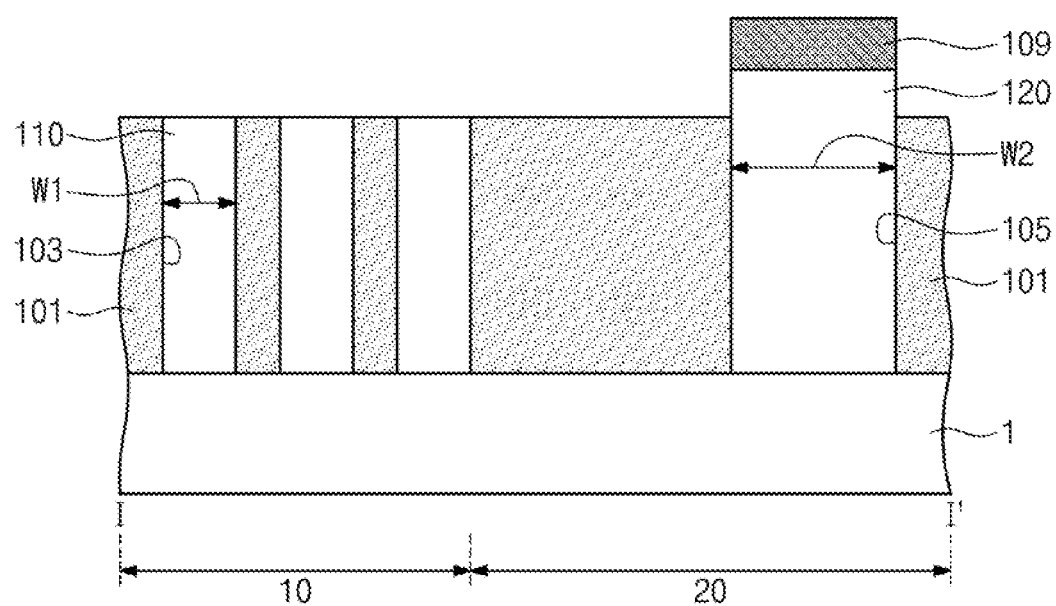
Figure 2C:
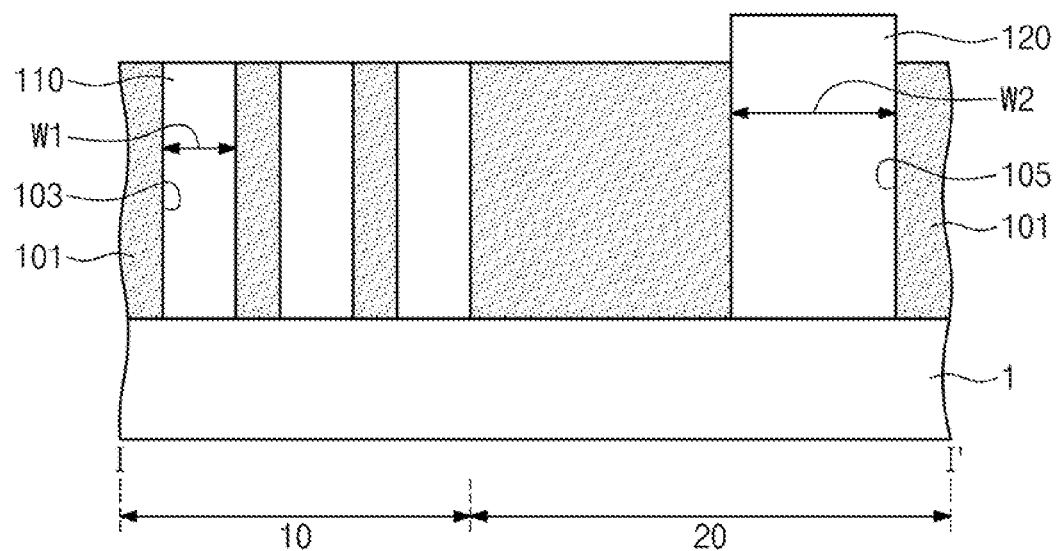

FIGS. 2A, 2B and 2C are cross-sectional views taken along line I-I' of FIG. 1, of a method of fabricating a semiconductor device according to an exemplary embodiment of the present inventive concept.

Referring to FIG. 2A, a first layer 101 may be formed on the semiconductor wafer 1. For example, the semiconductor wafer 1 may be or include a semiconductor wafer including silicon, germanium, or silicon-germanium; a silicon-on-insulator (SOI) wafer; or a germanium-on-insulator (GOI) wafer. The first layer 101 may have a first hole 103 and a second hole 105. The first hole 103 may be formed on each of the first regions 10 of the semiconductor wafer 1, and the second hole 105 may be formed on the second region 20 of the semiconductor wafer 1. The first hole 103 and the second hole 105 may respectively have a width W1 and a width W2 in the first direction X, and the width W1 may be less than the width W2 (W1<W2). The first layer 101 may include, for example, a silicon oxide layer or a silicon nitride layer. The first hole 103 and/or the second hole 105 may be formed along the third direction Z to expose an upper surface of the semiconductor wafer 1 facing along the third direction Z.

A second layer 107 may be formed on the first layer 101. The second layer 107 may be formed in the first and/or second holes 103 and 105. The second layer 107 may fill the first and second holes 103 and 105, and may be formed on a top surface of the first layer 101. The second layer 107 may substantially cover the top surface of the first layer 101 when it its formed. The second layer 107 may include, for example, a silicon oxide layer, a silicon nitride layer, or a conductive layer (e.g., TiN). A mask pattern 109 may be formed on the second layer 107 on the second region 20 of the semiconductor wafer 1. The mask pattern 109 may be disposed on a portion A of the second layer 107. Portion A may fill the second hole 105. The mask pattern 109 may include a material having an etch selectivity with respect to the first and second layers 101 and 107. The mask pattern 109 may include a carbon-based material and may include, for example, a photoresist pattern.

Referring to FIG. 2B, an etching process may be performed to etch the second layer 107 exposed by the mask pattern 109, and as a result, a pattern 110 may be formed in the first hole 103 and an overlay key pattern 120 may be formed in the second hole 105. The etching process may be, for example, a chemical mechanical polishing (CMP) process. The chemical mechanical polishing process may continue until the top surface of the first layer 101 is exposed. According to an exemplary embodiment of the present inventive concept, the mask pattern 109 may have a relatively small thickness, and thus the second layer 107 exposed by the mask pattern 109 may be polished by a polishing pad and a slurry provided between the polishing pad and the second layer 107, without being influenced by the mask pattern 109. The mask pattern 109 may protect the portion (see A of FIG. 2A) of the second layer 107 from being etched during the etching process, and the overlay key pattern 120 may thus have a top surface at substantially the same level as that of a top surface of the portion A of the second layer 107 which has not experienced the etching process. The top surface of the overlay key pattern 120 may be located at a level higher than that of a top surface of the pattern 110. Thus, the top surface of the overlay key pattern 120 may be located further from the substrate than the top surface of the pattern 110. The top surface of the pattern 110 may be coplanar with the top surface of the first layer 101. After the etching process, the mask pattern 109 may remain on the top surface of the overlay key pattern 120.

According to an exemplary embodiment of the present inventive concept, the mask pattern 109 may be formed on a location where the overlay key pattern 120 is formed, and the overlay key pattern 120 may then be prevented from being reduced in height during the polishing process.

Referring to FIG. 2C, the mask pattern 109 may be removed to expose the top surface of the overlay key pattern 120. During the removal of the mask pattern 109, there may be no removal of the first layer 101, the pattern 110, and the overlay key pattern 120 that have an etch selectivity with respect to the mask pattern 109. The mask pattern 109 may be removed by an ashing process and/or a strip process. In an exemplary embodiment of the present inventive concept, after the etching process, hydrofluoric acid (HF) may be used to perform a cleaning process that removes impurities generated from the etching process. In this case, the ashing process and/or the strip process may be omitted.

According to an exemplary embodiment of the present inventive concept, a method of forming an overlay key pattern may include providing a substrate (e.g., semiconductor wafer 1) and forming the first layer 101 on the substrate. The method may include forming a first hole (e.g., hole 103) and a second hole (e.g., hole 105) spaced apart from the first hole in the first layer 101. The method may include forming the second layer 107 on the substrate in the first hole and the second hole. The second layer 107 may be formed to extend above an upper end of the second hole opposite the substrate. The method may include polishing the second layer 107 to form the overlay key pattern 120 above the upper end of the second hole. The method may include forming the mask pattern 109 on the overlay key pattern 120. A width of the first hole may be less than a width of the second hole. The width of the mask pattern 109 may be substantially the same as the width of the second hole. Thus, loss of a desired thickness of the overlay key pattern 120 may be prevented as a result of the position of the mask pattern 109 above the upper end of the second hole (e.g., hole 105). Accordingly, reliability of the overlay key pattern may be increased.

FIGS. 3, 5, 7, 10, 13, and 17 are plan views of a method of fabricating a semiconductor device according to an exemplary embodiment of the present inventive concept. FIGS. 4, 6, 8, 9, 11, 12, 14, 15, 16, and 18 are cross-sectional views taken along line II-II' of FIGS. 3, 5, 7, 10, 13, and 17, of a method of fabricating a semiconductor device according to an exemplary embodiment of the present inventive concept.

Figure 3:
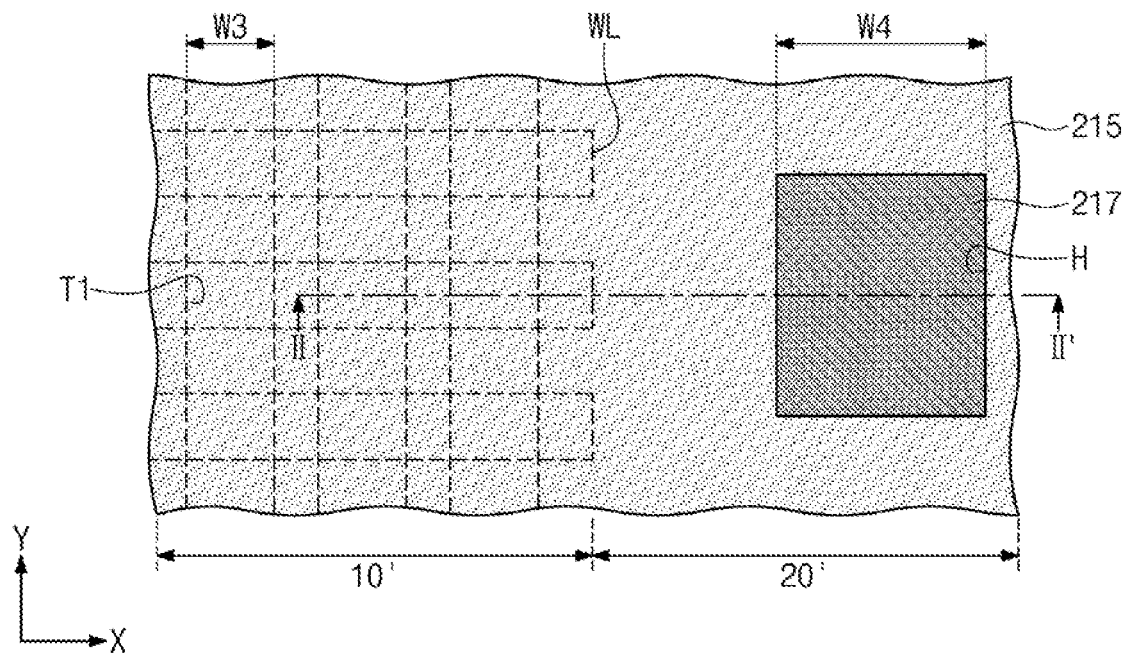
FIGS. 3, 5, 7, 10, 13, and 17 are plan views of a method of fabricating a semiconductor device according to an exemplary embodiment of the present inventive concept.
Figure 4:
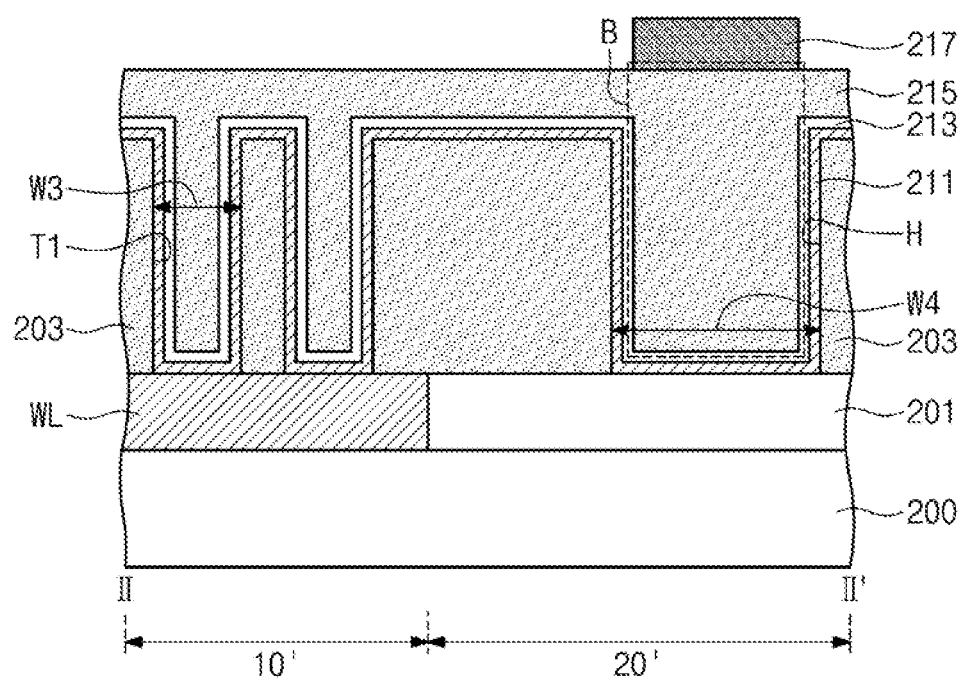
FIGS. 4, 6, 8, 9, 11, 12, 14, 15, 16, and 18 are cross-sectional views taken along line II-II' of FIGS. 3, 5, 7, 10, 13, and 17, of a method of fabricating a semiconductor device according to an exemplary embodiment of the present inventive concept.

Referring to FIGS. 3 and 4, word lines WL and a dielectric layer 201 may be formed on a semiconductor substrate 200. The semiconductor substrate 200 may include a first region 10' and a second region 20'. The first region 10' may be provided in plural, and the plurality of first regions 10' may be spaced apart from each other in the first direction X and the second direction Y (see, e.g., FIG. 1). The second region 20' may define the plurality of first regions 10' (see, e.g., FIG. 1). The first region 10' of the semiconductor substrate 200 may be a device area, and the second region 20' of the semiconductor substrate 200 may be a scribe lane area. Transistors and/or semiconductor memory devices may be formed on the device area, and overlay key patterns may be formed on the scribe lane area. In an exemplary embodiment of the present inventive concept, variable resistance memory devices may be formed on the first region 10' of the semiconductor substrate 200. The semiconductor substrate 200 may be or include a semiconductor substrate including silicon, germanium, or silicon-germanium; a silicon-on-insulator (SOI) substrate; or a germanium-on-insulator (GOI) substrate.

The word lines WL may be formed on the first region 10' of the semiconductor substrate 200. The formation of the word lines WL may include forming a conductive layer on the first and second regions 10' and 20' of the semiconductor substrate 200, and then patterning the conductive layer. The word lines WL may extend in the first direction X and may be spaced apart from each other in the second direction Y. Because the word lines WL are formed on the second region 20' of the semiconductor substrate 200, and a top surface of the second region 20' of the semiconductor substrate 200 may be exposed by the word lines WL.

The dielectric layer 201 may be formed on the second region 20' of the semiconductor substrate 200. The dielectric layer 201 may have a top surface coplanar with top surfaces of the word lines WL. In an exemplary embodiment of the present inventive concept, the dielectric layer 201 may fill spaces between the word lines WL that are adjacent to each other on the first region 10' of the semiconductor substrate 200. The dielectric layer 201 may include, for example, a silicon oxide layer.

A first dielectric layer 203 may be formed on the first and second regions 10' and 20' of the semiconductor substrate 200. The first dielectric layer 203 may have first trenches T1 and a hole H. The first trenches T1 may be disposed on the first region 10' of the semiconductor substrate 200, and the hole H may be disposed on the second region 20' of the semiconductor substrate 200. The first trenches T1 may partially expose the top surfaces of the word lines WL, and the hole H may partially expose the top surface of the dielectric layer 201. The first trenches T1 may extend in the second direction Y and may be spaced apart from each other in the first direction X. The first trench T1 and the hole H may respectively have a width W3 and a width W4 in the first direction X, and the width W3 may be less than the width W4 (W3<W4). The first dielectric layer 203 may include, for example, a silicon nitride layer.

A first electrode layer 211, a spacer layer 213, and a second dielectric layer 215 may be sequentially formed on the first dielectric layer 203. The first electrode layer 211, the spacer layer 213, and the second dielectric layer 215 may be conformally formed on the first dielectric layer 203, including in the first trench T1, in any other trenches formed in the first dielectric layer 203 and in the hole H. The first electrode layer 211 may conformally cover inner surfaces of the first trenches T1, an inner surface of the hole H, and a top surface of the first dielectric layer 203. The spacer layer 213 may conformally cover a top surface of the first electrode layer 211. The second dielectric layer 215 may cover a top surface of the spacer layer 213, while filling the first trenches T1 and the hole H in which the spacer layer 213 is formed. The first electrode layer 211 may include a conductive material. For example, the first electrode layer 211 may include one or more of W, Ti, Al, Cu, C, CN, TiN, TiAlN, TiSiN, TiCN, WN, CoSiN, WSiN, TaN, TaCN, TaSiN, or TiO. The spacer layer 213 may include, for example, a silicon oxide layer. The second dielectric layer 215 may include, for example, a silicon nitride layer.

A first mask pattern 217 may be formed on the second dielectric layer 215 on the second region 20' of the semiconductor substrate 200. In an exemplary embodiment of the present inventive concept, the first mask pattern 217 may be formed on a portion B of the second dielectric layer 215. Portion B may fill the hole H. The first mask pattern 217 may include a material having an etch selectivity with respect to the first dielectric layer 203, the first electrode layer 211, the spacer layer 213, and the second dielectric layer 215. The first mask pattern 217 may include a carbon-based material and may be, for example, a photoresist pattern.

Figure 5:
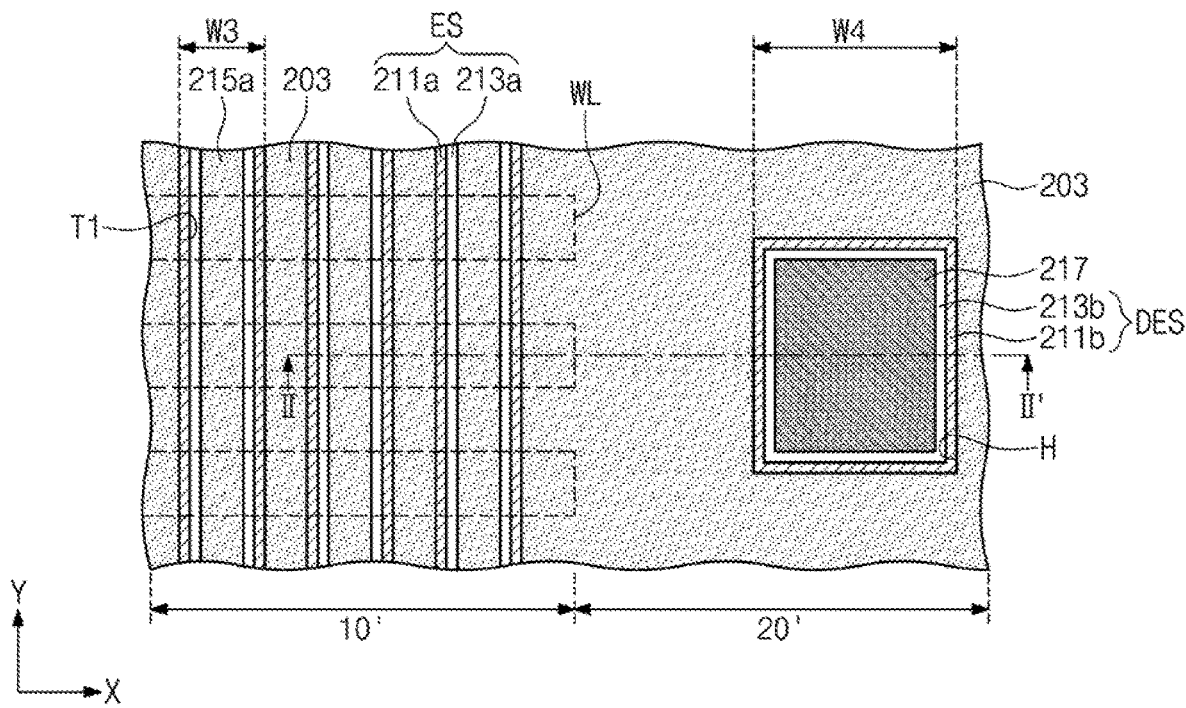
Figure 6:
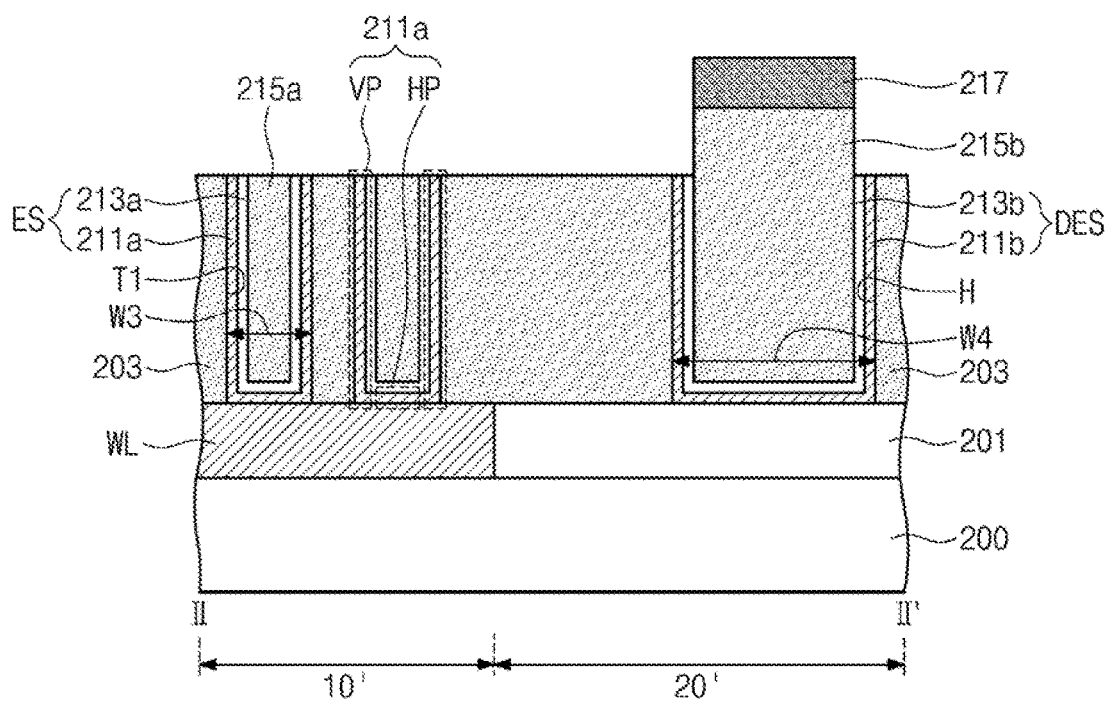

Referring to FIGS. 5 and 6, an etching process may be performed to sequentially etch the second dielectric layer 215, the spacer layer 213, and the first electrode layer 211 that are exposed by the first mask pattern 217. Accordingly, electrode structures ES and first dielectric patterns 215a thereon may be formed in the first trenches T1, and a dummy electrode structure DES and a second dielectric pattern 215b thereon may be formed in the hole H. In an exemplary embodiment of the present inventive concept, the etching process may be, for example, a chemical mechanical polishing (CMP) process. The chemical mechanical polishing process may continue until the top surface of the first dielectric layer 203 is exposed.

Each of the electrode structures ES may include a lower electrode 211a and a spacer 213a sequentially formed on the inner surface of the first trench T1. The first dielectric patterns 215a may fill the first trenches T1 in which the spacers 213a are formed. Each of the lower electrodes 211a may include vertical segments VP on opposite sidewalls of the first dielectric pattern 215a and the spacer 213a and also include a horizontal segment HP connecting the vertical segments VP to each other (e.g., at a bottom of a trench formed in the first dielectric layer 203). The vertical segments VP may be disposed on opposite sidewalk of the first trench T1, and the horizontal segment HP may be disposed on a bottom surface of the first trench T1. The horizontal segment HP may be disposed between the spacer 213a and the word line WL.

The dummy electrode structure DES may include a dummy electrode pattern 211b and a dummy spacer 213b that are sequentially formed on the inner surface of the hole H. The second dielectric pattern 215b may fill the hole H in which the dummy spacer 213b is formed. The first mask pattern 217 need not be completely etched during the etching process, and may cover a top surface of the portion B of the second dielectric layer 215 until the second dielectric pattern 215b is formed. After the etching process, the first mask pattern 217 may remain on a top surface of the second dielectric pattern 215b. In an exemplary embodiment of the present inventive concept, the second dielectric pattern 215b may be used as an overlay key pattern.

The electrode structures ES, the first dielectric patterns 215a, the dummy electrode structure DES, and the first dielectric layer 203 may have their top surfaces coplanar with each other. The top surface of the second dielectric pattern 215b may be located at a level higher than that of the top surface of the dummy electrode structure DES and those of the top surfaces of the first dielectric patterns 215a. Thus, top surfaces of the electrode structures ES, the first dielectric patterns 215a, the dummy electrode structure DES, and the first dielectric layer 203 may each be spaced substantially a same distance from the semiconductor substrate 200.

According to an exemplary embodiment of the present inventive concept, the first mask pattern 217 may be formed on the top surface of the portion B of the second dielectric layer 215, on which portion B the second dielectric pattern 215b is formed, and as a result, it may be possible to prevent damage (e.g., reduction in height) of the second dielectric pattern 215b serving as an overlay key pattern during the polishing process.

Figure 7:
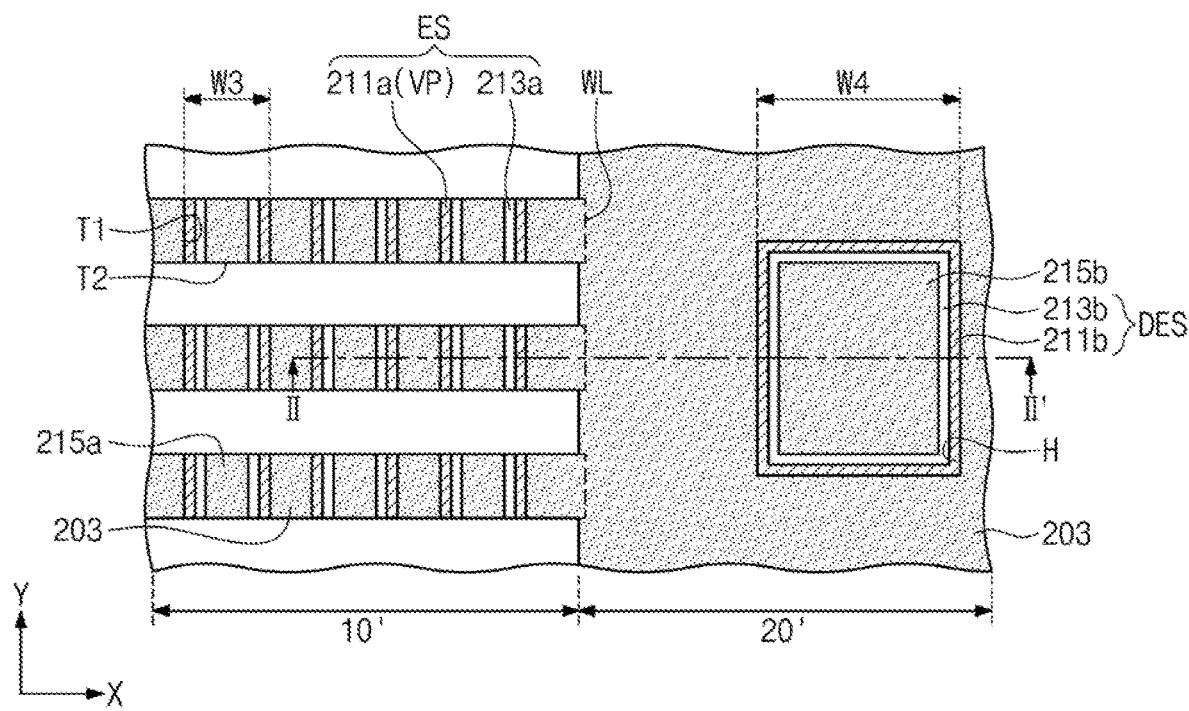
Figure 8:
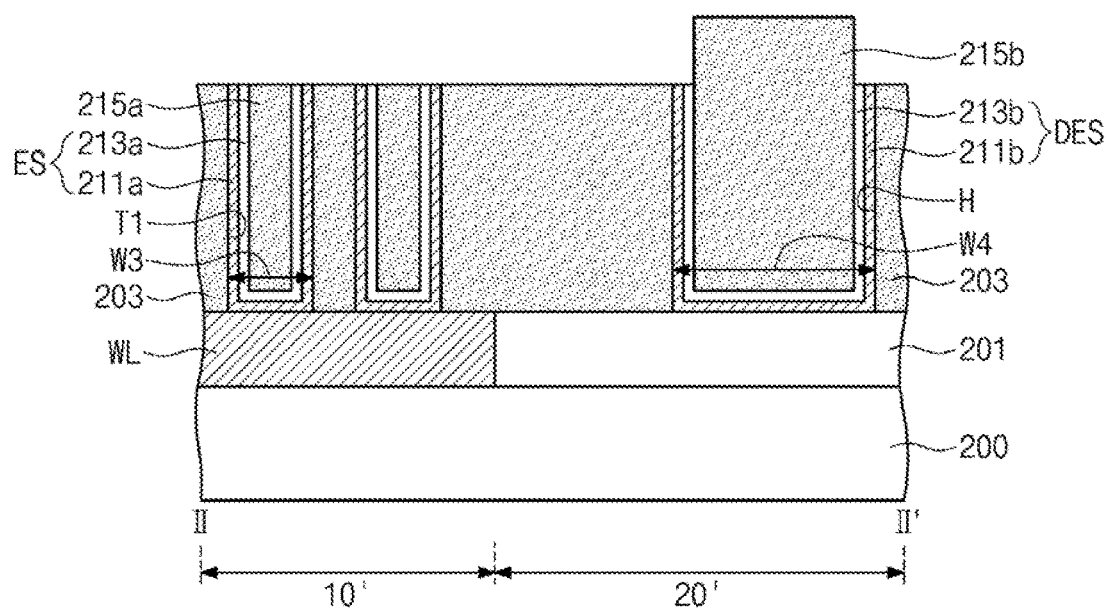

Referring to FIGS. 7 and 8, after the second dielectric pattern 215b is formed, the first mask pattern 217 may be removed. When the first mask pattern 217 is removed, there may be no removal of the electrode structures ES, the first dielectric patterns 215a, the dummy electrode structure DES, and the second dielectric pattern 215b. The removal of the first mask pattern 217 may expose the top surface of the second dielectric pattern 215b. The first mask pattern 217 may be removed by an ashing process and/or a strip process. In an exemplary embodiment of the present inventive concept, when a cleaning process using hydrofluoric acid (HF) is performed after the etching process, the first mask pattern 217 may be removed by the cleaning process. In this case, the ashing process and/or the strip process may be omitted.

Second trenches T2 may be formed in the first dielectric layer 203 on the first region 10' of the semiconductor substrate 200. The formation of the second trenches T2 may include forming a mask pattern on the first dielectric layer 203, the electrode structures ES, the first dielectric patterns 215a, the dummy electrode structure DES, and the second dielectric pattern 215b, and then using the mask pattern as an etching mask to partially etch the electrode structures ES, the first dielectric patterns 215a, and the first dielectric layer 203 formed on the first region 10' of the semiconductor substrate 200. The second trenches T2 may extend in the first direction X. When viewed in a plan view (e.g., along the third direction Z), each of the second trenches T2 may be disposed between the word lines WL adjacent to each other in the second direction Y.

The second trenches T2 may separate each of the electrode structures ES having linear shapes extending in the second direction Y into a plurality of segments in the second direction Y, and also separate each of the first dielectric patterns 215a having linear shapes extending in the second direction Y into a plurality of segments in the second direction Y. The separated electrode structures ES may be spaced apart from each other in the first and second directions X and Y, and the same may be true of the separated first dielectric patterns 215a. The electrode structures ES may vertically overlap the word lines WL. The electrode structures ES arranged in the first direction X may be spaced apart from each other across the first dielectric layer 203, and the electrode structures ES arranged in the second direction Y may be spaced apart from each other across the second trenches T2.

Figure 9:
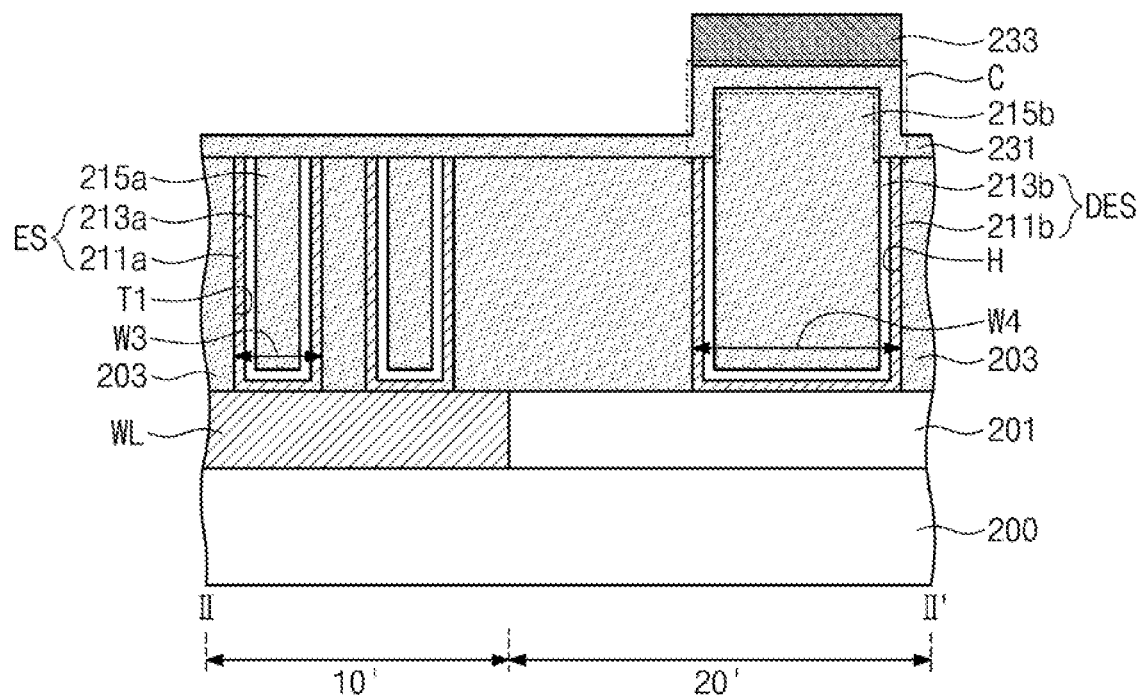

Referring to FIG. 9, a third dielectric layer 231 may be formed on the first dielectric layer 203. The third dielectric layer 231 may conformally cover the top surface of the first dielectric layer 203, the top surfaces of the electrode structures ES, and the top surfaces of the first dielectric patterns 215a, the top surface of the dummy electrode structure DES, and the top surface of the second dielectric pattern 215b. The third dielectric layer 231 may include, for example, a silicon nitride layer. The third dielectric layer 231 may be formed in, and may substantially fill, the second trenches T2.

A second mask pattern 233 may be formed on the third dielectric layer 231 on the second region 20' of the semiconductor substrate 200. The second mask pattern 233 may vertically overlap (e.g., along the third direction Z) the dummy electrode structure DES and the second dielectric pattern 215b. The second mask pattern 233 may be disposed on a top surface of a portion C of the third dielectric layer 231. Portion C may cover the top surface of the second dielectric pattern 215b and the top surface of the dummy electrode structure DES. For example, the second mask pattern 233 may have a width substantially the same as the width W4 of the hole H. The second mask pattern 233 may include a material having an etch selectivity with respect to the third dielectric layer 231. The second mask pattern 233 may include a carbon-based material and may be, for example, a photoresist pattern.

Figure 10:
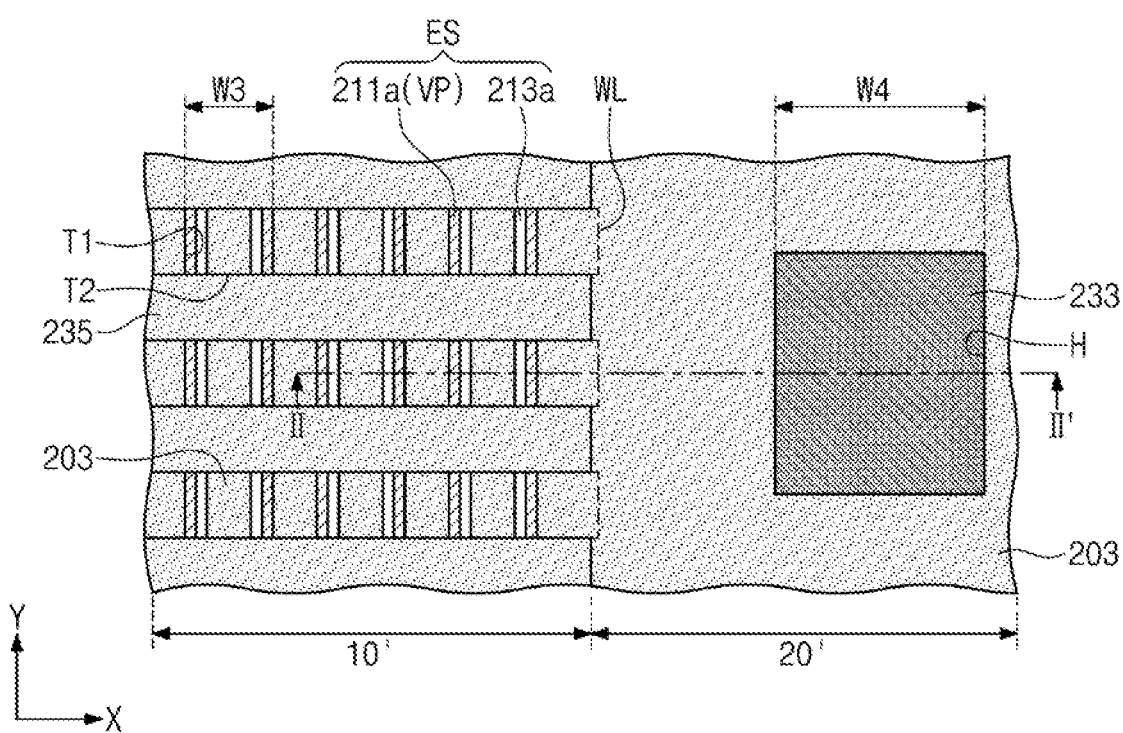
Figure 11:
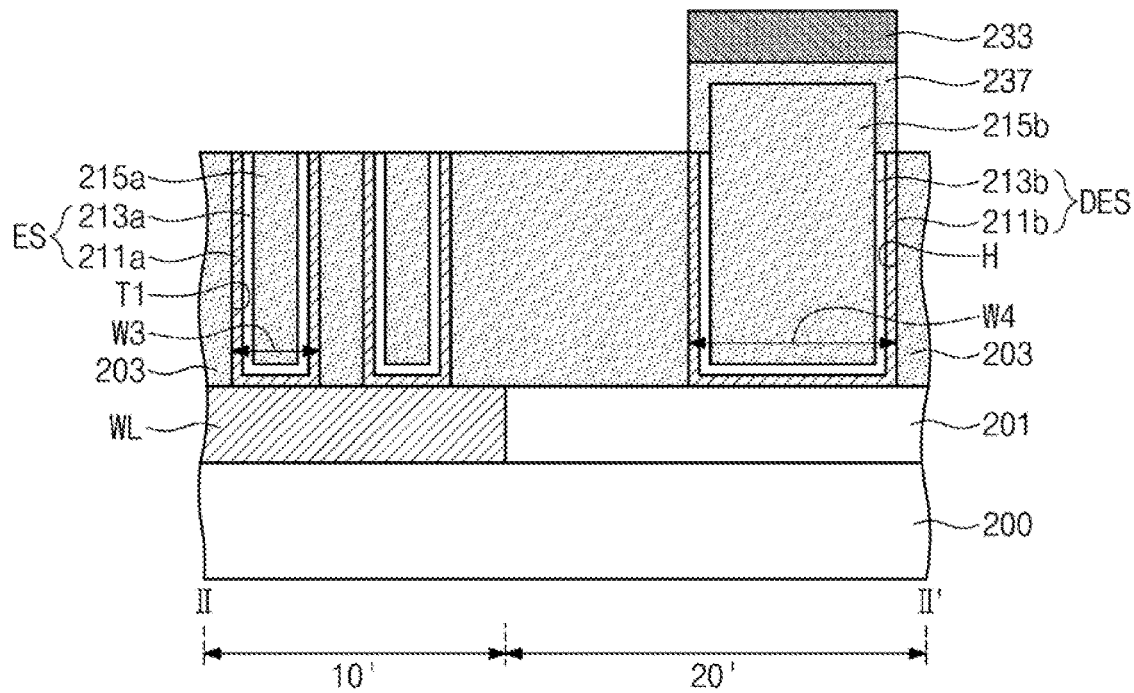

Referring to FIGS. 10 and 11, an etching process may be performed such that the third dielectric layer 231 exposed by the second mask pattern 233 is etched to form separation patterns 235 and a capping dielectric pattern 237. The separation patterns 235 may be formed in, and may substantially fill, the second trenches T2, and the capping dielectric pattern 237 may be formed on the dummy electrode structure DES and the second dielectric pattern 215b. In an exemplary embodiment of the present inventive concept, the etching process may be a chemical mechanical polishing (CMP) process. The chemical mechanical polishing process may continue until exposing the top surface of the first dielectric layer 203 and the top surfaces of the electrode structures ES.

The separation patterns 235 may have top surfaces coplanar (e.g., spaced an equal distance from the semiconductor wafer 200) with the top surfaces of the electrode structures ES, the top surfaces of the first dielectric patterns 215a, and the top surface of the first dielectric layer 203. The capping dielectric pattern 237 may cover the top surface of the dummy electrode structure DES and the top and lateral surfaces of the second dielectric pattern 215b exposed by the dummy electrode structure DES. The capping dielectric pattern 237 may have a top surface at a level higher than those of the top surfaces of the separation patterns 235 (e.g., with respect to the semiconductor wafer 200). The second mask pattern 233 need not be etched during the etching process, but may cover the top surface of the portion C of the third dielectric layer 231 until the capping dielectric pattern 237 is formed. After the etching process, the second mask pattern 233 may remain on the top surface of the capping dielectric pattern 237. In an exemplary embodiment of the present inventive concept, the second dielectric pattern 215b and the capping dielectric pattern 237 may be used as an overlay key pattern.

The second mask pattern 233 may be removed after the capping dielectric pattern 237 is formed. When the second mask pattern 233 is removed, there may be no removal of the electrode structure ES, the separation patterns 235, the first dielectric patterns 215a, and the first dielectric layer 203. The removal of the second mask pattern 233 may expose the top surface of the capping dielectric pattern 237. The second mask pattern 233 may be removed by an ashing process and/or a strip process. In an exemplary embodiment of the present inventive concept, when a cleaning process using hydrofluoric acid (HF) is performed after the etching process, the second mask pattern 233 may be removed by the cleaning process. In this case, the ashing process and/or the strip process may be omitted.

Figure 12:
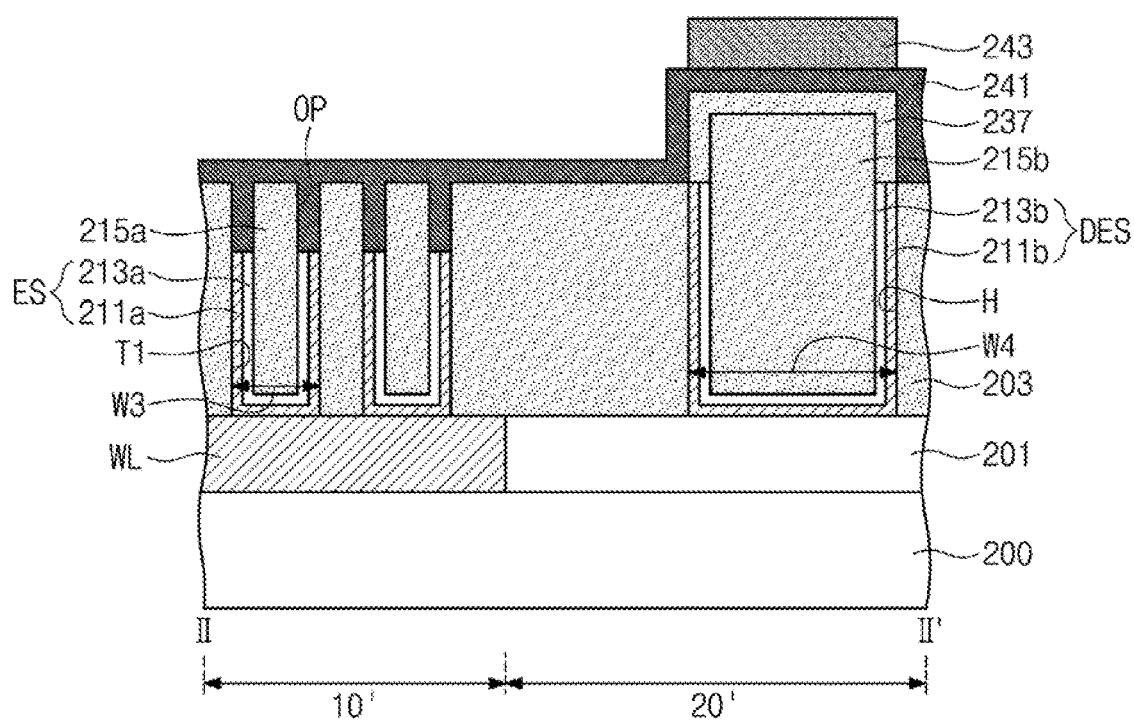

Referring to FIG. 12, an etching process may be performed to etch upper portions of the electrode structures ES (e.g., portions that are opposite the semiconductor substrate 200). For example, the lower electrodes 211a and the spacers 213a may be etched on upper portions thereof. Therefore, the top surfaces of the electrode structures ES may be recessed from the top surface of the first dielectric layer 203 such that the electrode structures ES may be provided thereon with spaces OP. The spaces OP may be surrounded by the first dielectric layer 203, the first dielectric patterns 215a, and the separation patterns 235. For example, side surfaces of the spaces OP facing along the first and/or second directions X and/or Y may be surrounded by the first dielectric layer 203, the first dielectric patterns 215a, and the separation patterns 235.

A phase change layer 241 may be formed on the first and second regions 10' and 20' of the semiconductor substrate 200. The phase change layer 241 may fill the spaces OP and cover the top surface of the first dielectric layer 203, the top surfaces of the first dielectric patterns 215a, the top and lateral surfaces of the capping dielectric pattern 237, and the top surfaces of the separation patterns 235. The phase change layer 241 may include, for example, a compound in which one or more of Te and Se as chalcogen elements is combined with one or more of Ge, Sb, Bi, Pb, Sn, Ag, As, S, Si, In, Ti, Ga, P, O or C. For example, the phase change layer 241 may include one or more of GeSbTe, GeTeAs, SbTeSe, GeTe, SbTe, SeTeSn, GeTeSe, SbSeBi, GeBiTe, GeTeTi, InSe, GaTeSe, or InSbTe.

Alternatively, the phase change layer 241 may include one or more of perovskite compounds or conductive metal oxides. For example, the phase change layer 241 may include one or more of niobium oxide, titanium oxide, nickel oxide, zirconium oxide, vanadium oxide, PCMO ((Pr,Ca)MnO$_3$), strontium-titanium oxide, barium-strontium-titanium oxide, strontium-zirconium oxide, barium-zirconium oxide, or barium-strontium-zirconium oxide. When the phase change layer 241 includes transition metal oxide, the phase change layer 241 may have a dielectric constant greater than that of silicon oxide. Alternatively, the phase change layer 241 may have either a double structure of a conductive metal oxide layer and a tunnel dielectric layer or a triple structure of a first conductive metal oxide layer, a tunnel dielectric layer, and a second conductive metal oxide layer. The tunnel dielectric layer may include aluminum oxide, hafnium oxide, or silicon oxide.

A third mask pattern 243 may be formed on the phase change layer 241 on the second region 20' of the semiconductor substrate 200. The third mask pattern 243 may vertically overlap the capping dielectric pattern 237 (e.g., along the third direction Z). The third mask pattern 243 may include a material having an etch selectivity with respect to the phase change layer 241. The third mask pattern 243 may include a carbon-based material and may be, for example, a photoresist pattern.

Figure 13:
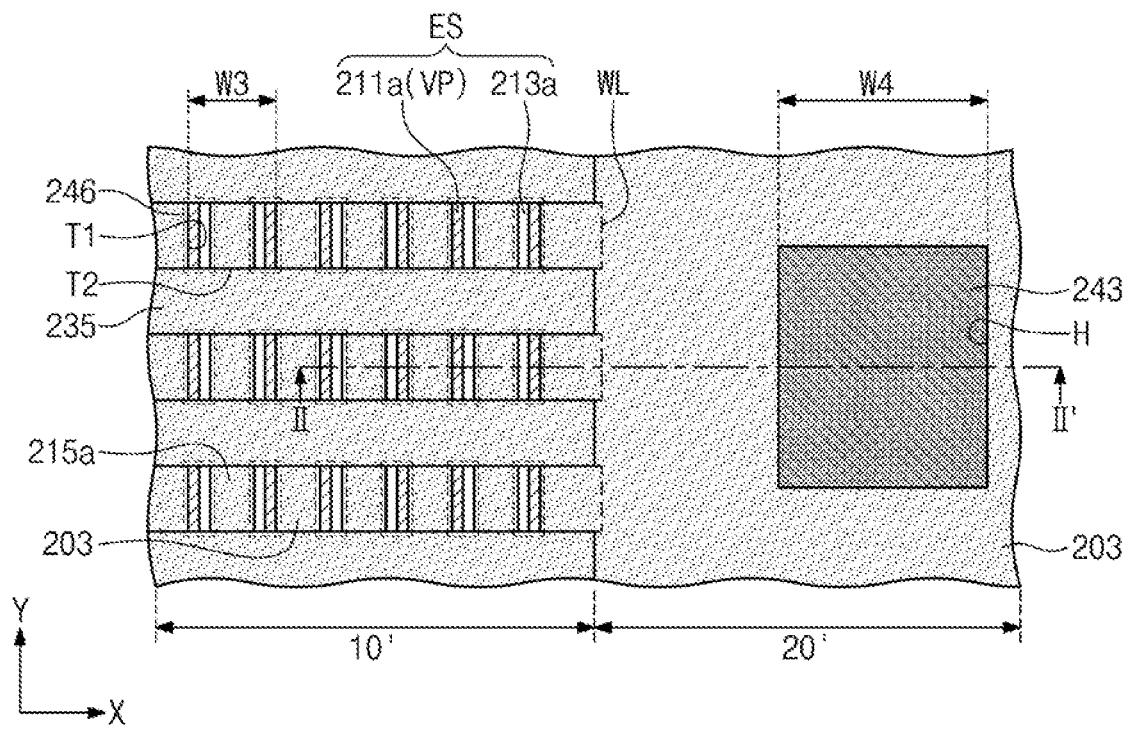
Figure 14:
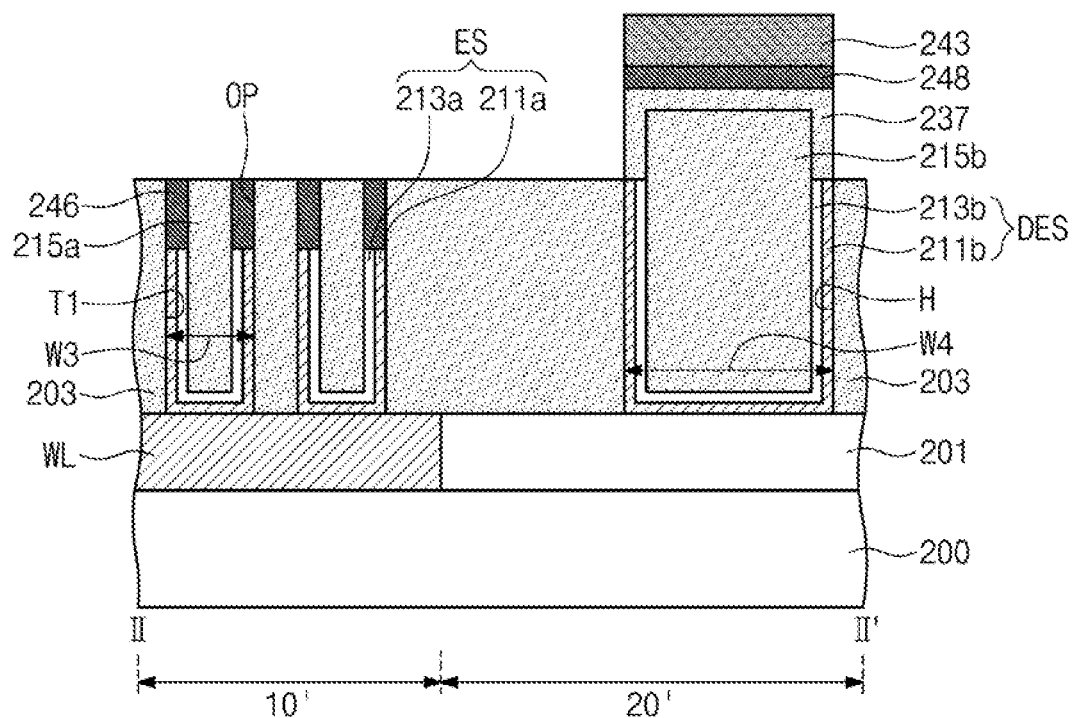

Referring to FIGS. 13 and 14, phase change patterns 246 may be formed in the spaces OP, and a dummy phase change pattern 248 may be formed on the capping dielectric pattern 237. The phase change patterns 246 may be provided on intersections between the word lines WL and the vertical segments VP of the lower electrodes 211a. The phase change patterns 246 may cover top surfaces of the spacers 213a on lateral surfaces of the vertical segments VP of the lower electrodes 211a. The phase change patterns 246 and the dummy phase change pattern 248 may be formed by performing an etching process on the phase change layer 241 exposed by the third mask pattern 243. In an exemplary embodiment of the present inventive concept, the etching process may be a chemical mechanical polishing (CMP) process. The chemical mechanical polishing process may continue until the top surface of the first dielectric layer 203 is exposed. The third mask pattern 243 need not be etched during the etching process, but may cover a top surface of the phase change layer 241 overlapping the capping dielectric pattern 237 until the dummy phase change pattern 248 is formed. After the etching process, the third mask pattern 243 may remain on a top surface of the dummy phase change pattern 248. The third mask pattern 243 and the dummy phase change pattern 248 may expose top surfaces of the phase change patterns 246.

Figure 15:
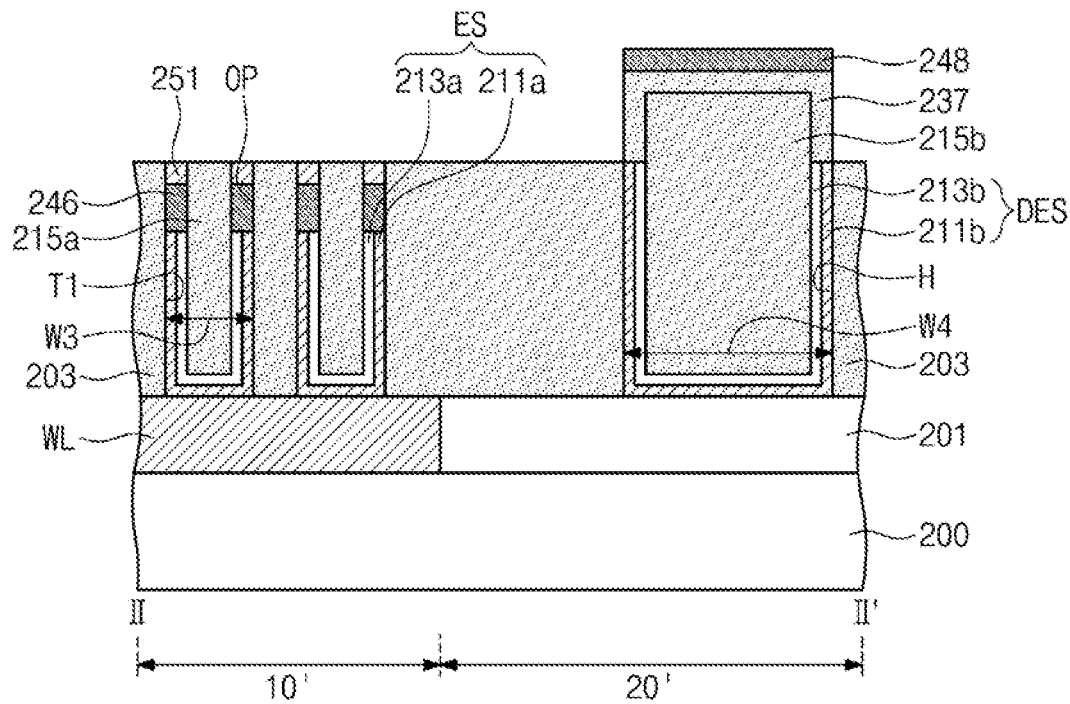

Referring to FIG. 15, the third mask pattern 243 may be removed after the phase change patterns 246 are formed. When the third mask pattern 243 is removed, there may be no removal of the first dielectric layer 203, the first dielectric patterns 215a, the separation patterns 235, and the phase change patterns 246. The removal of the third mask pattern 243 may expose the top surface of the dummy phase change pattern 248. The third mask pattern 243 may be removed by an ashing process and/or a strip process. In an exemplary embodiment of the present inventive concept, when a cleaning process using hydrofluoric acid (HF) is performed after the etching process, the third mask pattern 243 may be removed by the cleaning process. In this case, the ashing process and/or the strip process may be omitted.

Intermediate electrodes 251 may be formed on the top surfaces of the phase change patterns 246 in the spaces OP. The formation of the intermediate electrodes 251 may include etching upper portions of the phase change patterns 246 and then filling the spaces OP on the top surfaces of the phase change patterns 246. The intermediate electrodes 251 may include one or more of W, Ti, Al, Cu, C, CN, TiN, TiAlN, TiSiN, TiCN, WN, CoSiN, WSiN, TaN, TaCN, TaSiN, or TiO.

Figure 16:
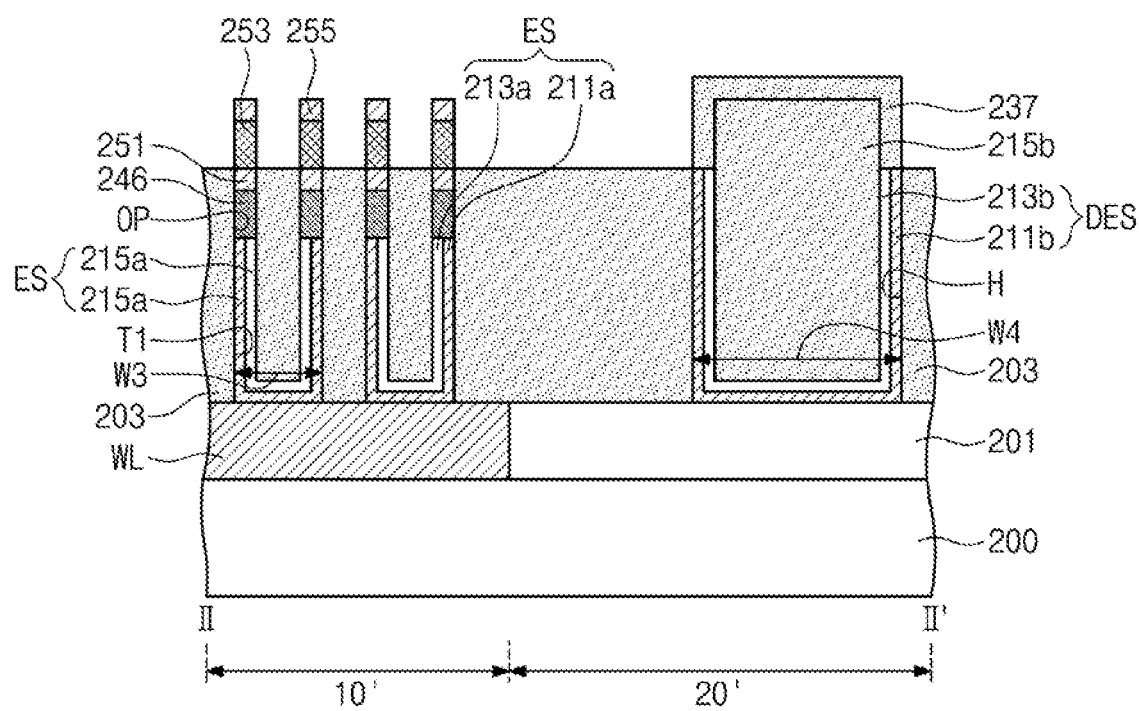

Referring to FIG. 16, the dummy phase change pattern 248 may be removed. A mask layer may be formed on the first region 10' of the semiconductor substrate 200, and then used to selectively remove the dummy phase change pattern 248. The removal of the dummy phase change pattern 248 may expose the top surface of the capping dielectric pattern 237. In an exemplary embodiment of the present inventive concept, the removal of the dummy phase change pattern 248 may prevent poor or no detection of optical signals from the dummy phase change pattern 248 including an opaque substance in a process step that requires reading of an overlay key pattern (e.g., the second dielectric pattern 215b and the capping dielectric pattern 237). A dry or wet etching process may be performed to remove the dummy phase change pattern 248. After the dummy phase change pattern 248 is removed, the mask layer may be removed from the first region 10' of the semiconductor substrate 200.

Switching components 253 and upper electrodes 255 may be sequentially formed on the intermediate electrodes 251. The formation of the switching components 253 and the upper electrodes 255 may include sequentially forming a switching component layer and an electrode layer on the first region 10' of the semiconductor substrate 200, and then sequentially patterning the electrode layer and the switching component layer. The switching components 253 may be spaced apart from each other in the first and second directions X and Y on top surfaces of the intermediate electrodes 251, and the same may be true of the upper electrodes 255.

The switching components 253 may include a compound in which one or more of Te and Se as chalcogen elements are combined with one or more of Ge, Sb, Bi, Al, Pb, Sn, Ag, As, S, Si, In, Ti, Ga or P. The switching components 253 may further include a thermal stabilization element in addition to the compound. The thermal stabilization element may be or include one or more of C, N, or O. For example, the switching components 253 may include one or more of AsTe, AsSe, GeTe, SnTe, GeSe, SnTe, SnSe, ZnTe, AsTeSe, AsTeGe, AsSeGe, AsTeGeSe, AsSeGeSi, AsSeGeC, AsTeGeSi, AsTeGeS, AsTeGeSiIn, AsTeGeSiP, AsTeGeSiSbS, AsTeGeSiSbP, AsTeGeSeSb, AsTeGeSeSi, AsTeGeSiSeNS, SeTeGeSi, GeSbTeSe, GeBiTeSe, GeAsSbSe, GeAsBiTe, GeAsBiSe. The upper electrodes 255 may include, for example, one or more of W, Ti, Al, Cu, C, CN, TiN, TiAlN, TiSiN, TiCN, WN, CoSiN, WSiN, TaN, TaCN, TaSiN, or TiO.

Figure 17:
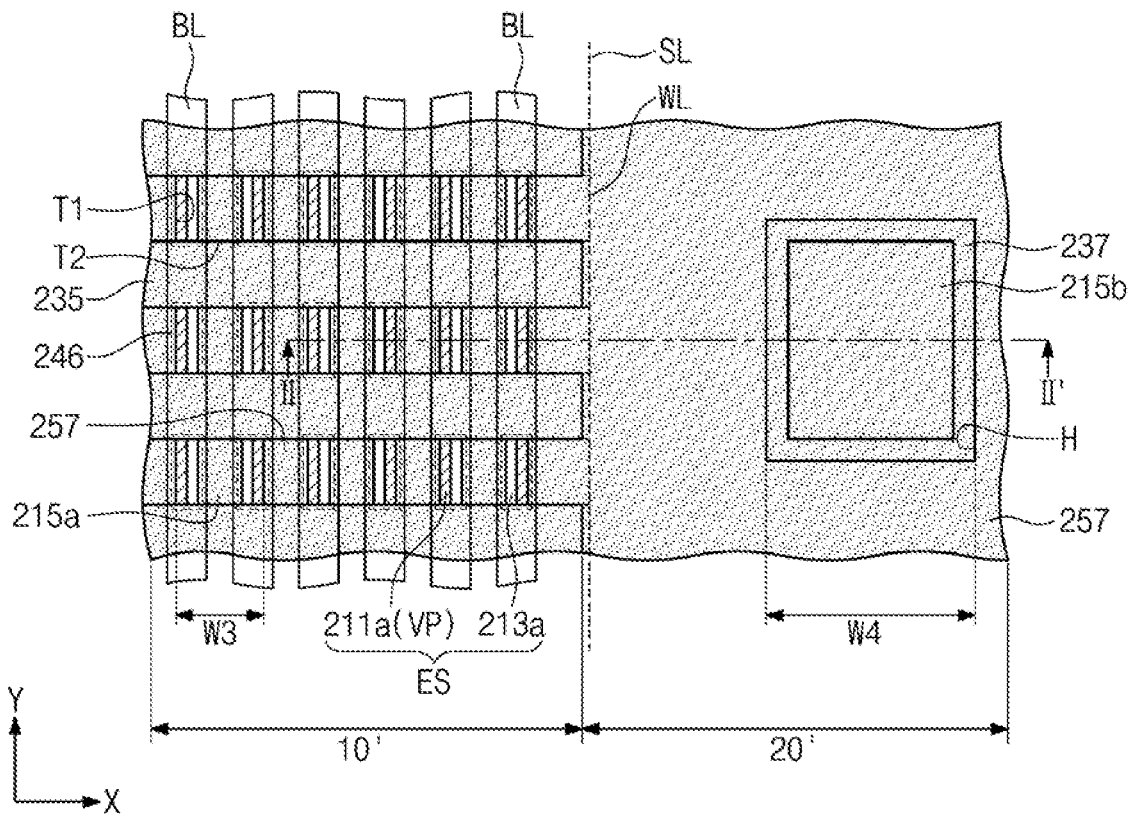
Figure 18:
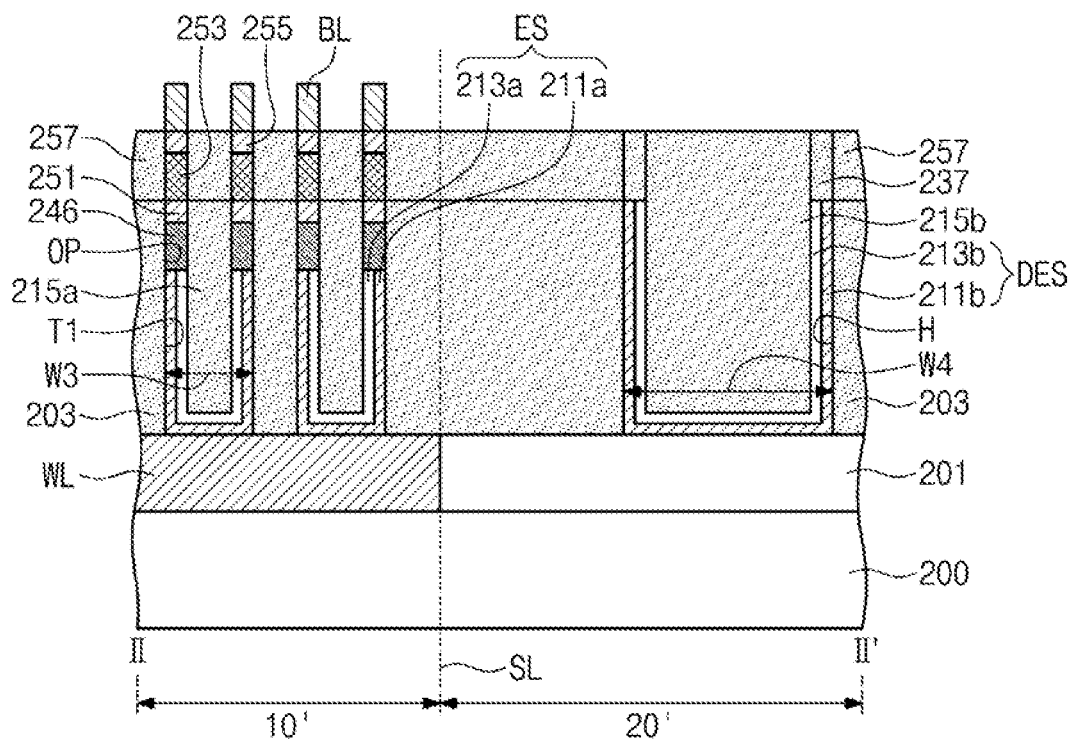

Referring to FIGS. 17 and 18, a fourth dielectric layer 257 may be formed to cover lateral surfaces of the switching components 253, lateral surfaces of the upper electrodes 255, and the lateral surfaces of the capping dielectric pattern 237. The formation of the fourth dielectric layer 257 may include forming a dielectric layer to cover spaces between the switching components 253, spaces between the upper electrodes 255, the top surfaces of the separation patterns 235, and the top and lateral surfaces of the capping dielectric pattern 237, and then performing a planarization process until top surfaces of the upper electrodes 255 are exposed. When the planarization process is completed, the top surface of the second dielectric pattern 215b may be exposed. The top surface of the second dielectric pattern 215b may be coplanar with a top surface of the fourth dielectric layer 257 and the top surfaces of the upper electrodes 255. Alternatively, when the planarization process is completed, the capping dielectric pattern 237 may cover the top surface of the second dielectric pattern 215b, and the top surface of the fourth dielectric layer 257 may be coplanar with the top surface of the second dielectric pattern 215b. The fourth dielectric layer 257 may include, for example, a silicon nitride layer.

Bit lines BL may be formed on the upper electrodes 255. The bit lines BL may extend in the second direction Y on the upper electrodes 255 arranged in the second direction Y. A single bit line BL may be electrically connected to the upper electrodes 255 arranged in the second direction Y. The bit lines BL may include one or more metals, such as copper or aluminum, and conductive metal nitride, such as TiN or WN.

The semiconductor substrate 200 may be cut along a cutting line SL, and thus the first region 10' and the second region 20' may be separated from each other. The first region 10' on which variable resistance memory devices are formed may be used as a unit semiconductor chip.

According to an exemplary embodiment of the present inventive concept, when a polishing process is performed on a layer to form a pattern on a device area and an overlay key pattern on a scribe lane area, a mask pattern may be formed on a portion of the layer. Thus, the portion of the layer may be converted into the overlay key pattern. The mask pattern may protect a top surface of the overlay key pattern from being etched, and thus it may be possible to prevent a reduction in height of the overlay key pattern when the polishing process is performed. Thus, reliability of the overlay key pattern may be increased.

While the present inventive concept has been shown and described with reference to the exemplary embodiments thereof, it will be apparent to those of ordinary skill in the art that various changes in form and detail may be made thereto without departing from the spirit and scope of the present inventive concept.

What is claimed is:

1. A method of fabricating a semiconductor device, the method comprising:
   providing a substrate including a first region and a second region;
   forming a first layer on the substrate, the first layer having a first hole on the first region and a second hole on the second region;
   forming a second layer in the first hole and the second hole;
   forming a mask pattern on the second region of the substrate; and
   polishing the second layer to form a pattern in the first hole and an overlay key pattern in the second hole,
   wherein an entire top surface of the overlay key pattern is further from the substrate than a top surface of the pattern in the first hole.

2. The method of claim 1, wherein the mask pattern comprises a material having an etch selectivity with respect to the first layer and the second layer.

3. The method of claim 1, wherein a width of the first hole is less than a width of the second hole.

4. The method of claim 1, wherein the first region is a device area, and the second region is a scribe lane area.

5. The method of claim 1, wherein the top surface of the pattern formed in the first hole is coplanar with a top surface of the first layer.

6. The method of claim 1, wherein polishing the second layer comprises performing a chemical mechanical polishing (CMP) process on the second layer.

7. The method of claim 1, wherein, after the second layer is polished, the mask pattern remains on the entire top surface of the overlay key pattern.

8. The method of claim 1, further comprising performing an ashing process or strip process on the mask pattern to remove the mask pattern.

9. The method of claim 1, further comprising performing a cleaning process to remove impurities generated when the second layer is polished,
   wherein the mask pattern is removed when the cleaning process is performed, and
   wherein the cleaning process uses hydrofluoric acid (HF).

10. A method of fabricating a semiconductor device, the method comprising:
    providing a substrate including a first region and a second region;
    forming a first dielectric layer on the substrate, the first dielectric layer having a first trench on the first region and a hole on the second region;
    sequentially forming an electrode layer, a spacer layer, and a second dielectric layer on each of a top surface of the first dielectric layer, an inner surface of the first trench, and an inner surface of the hole;
    forming a first mask pattern on the second region of the substrate; and
    polishing the second dielectric layer, the spacer layer, and the electrode layer to form an electrode structure and a first dielectric pattern on the electrode structure in the first trench and to form a dummy electrode structure and a second dielectric pattern on the dummy electrode structure in the hole,
    wherein a top surface of the second dielectric pattern is further from the substrate than a top surface of the first dielectric pattern.

11. The method of claim 10, wherein the first mask pattern substantially covers the top surface of the second dielectric pattern.

12. The method of claim 10, wherein a top surface of the electrode structure, the top surface of the first dielectric pattern, and a top surface of the dummy electrode structure are coplanar with each other.

13. The method of claim 10, wherein polishing the second dielectric layer, the spacer layer, and the electrode layer comprises performing a chemical mechanical polishing process to etch the second dielectric layer, the spacer layer, and the electrode layer exposed by the first mask pattern, the chemical mechanical polishing process being performed until a top surface of the first dielectric layer is exposed.

14. The method of claim 10, wherein a width of the first trench is less than a width of the hole.

15. The method of claim 10, wherein the first mask pattern comprises a material having an etch selectivity with respect to the first dielectric layer, the electrode layer, the spacer layer, and the second dielectric layer.

16. The method of claim 10, wherein the electrode structure extends in a first direction, and wherein the method further comprises:

forming in the first dielectric layer a second trench extending in a second direction intersecting the first direction by etching the electrode structure, the first dielectric pattern, and the first dielectric layer that are formed on the first region of the substrate;

forming a third dielectric layer in the second trench and covering the top surface of the first dielectric layer, a top surface of the electrode structure, a top surface of the dummy electrode structure, the top surface of the first dielectric pattern, and the top surface of the second dielectric pattern;

forming a second mask pattern on the third dielectric layer formed on the second region of the substrate; and etching the third dielectric layer exposed by the second mask pattern to form a separation pattern in the second trench and to form a capping dielectric pattern on the top surface of the second dielectric pattern.

17. The method of claim 16, wherein a top surface of the separation pattern is separated a same distance from the substrate as the top surface of the first dielectric pattern, and a top surface of the capping dielectric pattern is further from the substrate than the top surface of the separation pattern.

18. A method of forming an overlay key pattern, comprising:

providing a substrate;

forming a first layer on the substrate;

forming a first hole and a second hole spaced apart from the first hole in the first layer;

forming a second layer on the substrate in the first hole and the second hole, wherein the second layer is formed to extend above an upper end of the second hole opposite the substrate;

polishing the second layer to form the overlay key pattern above the upper end of the second hole; and forming a mask pattern on the overlay key pattern, wherein a width of the mask pattern is substantially the same as a width of the second hole.

19. The method of claim 18, wherein a width of the first hole is less than the width of the second hole.

* * * * *